United States Patent
Walczyk et al.

(10) Patent No.: US 10,566,263 B2
(45) Date of Patent: Feb. 18, 2020

(54) CONFORMABLE HEAT SPREADER

(71) Applicant: Intel Corporation, Santa Clara, CA (US)

(72) Inventors: Joe Walczyk, Tigard, OR (US); John C. Johnson, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 129 days.

(21) Appl. No.: 15/718,337

(22) Filed: Sep. 28, 2017

(65) Prior Publication Data
US 2019/0096785 A1    Mar. 28, 2019

(51) Int. Cl.
| | | |
|---|---|---|
| H01L 23/427 | (2006.01) | |
| F28F 1/40 | (2006.01) | |
| G01R 31/26 | (2014.01) | |

(52) U.S. Cl.
CPC .............. *H01L 23/427* (2013.01); *F28F 1/40* (2013.01); *F28F 2215/14* (2013.01); *F28F 2250/08* (2013.01); *F28F 2255/02* (2013.01); *F28F 2255/18* (2013.01); *G01R 31/2601* (2013.01)

(58) Field of Classification Search
CPC ....... H01L 23/427; H01L 23/40; H01L 23/34; H01L 23/46; H01L 23/467; H01L 23/473; F28F 1/40; F28F 2215/14; F28F 2250/08; F28F 2255/02; F28F 2255/18; G01R 31/2601; F28D 2021/0028; F28D 2021/0029
USPC .................. 165/80.4, 80.1, 80.2, 80.5, 185
See application file for complete search history.

(56) References Cited

U.S. PATENT DOCUMENTS

| | | | | |
|---|---|---|---|---|
| 5,412,535 A | * | 5/1995 | Chao .................... | F28D 15/0275 165/104.33 |
| 5,458,189 A | * | 10/1995 | Larson ................ | F28D 15/0241 165/104.27 |
| 5,485,671 A | * | 1/1996 | Larson ................ | F28D 15/0241 165/104.19 |
| 5,500,256 A | * | 3/1996 | Watabe ............. | C23C 16/45561 118/715 |
| 6,650,544 B1 | * | 11/2003 | Lai ........................ | F28D 15/046 165/104.21 |
| 2005/0280162 A1 | * | 12/2005 | Mok ..................... | H01L 23/427 257/778 |

(Continued)

FOREIGN PATENT DOCUMENTS

CN        109588007        4/2019

*Primary Examiner* — Justin M Jonaitis
(74) *Attorney, Agent, or Firm* — Schwegman Lundberg & Woessner, P.A.

(57) ABSTRACT

A heat spreader apparatus, testing system, method may be used to test an electronic device. The heat spreader may include a hollow housing. The hollow housing may define an interior chamber. The hollow housing may include a contact surface. The heat spreader may include a working fluid. The working fluid may be included in the interior chamber. The hollow housing may be configured to be physically compliant. The hollow housing may be physically compliant such that the hollow housing conforms to the shape of a testing surface in response to an applied pressure. The testing surface may be a top surface of a semiconductor. The testing surface may be curved or otherwise lack uniformity. The hollow housing may conform to the curvature or lack of uniformity of the testing surface such that minimal gaps exist between the hollow housing and the surface.

25 Claims, 8 Drawing Sheets

(56) References Cited

U.S. PATENT DOCUMENTS

2010/0326630 A1* 12/2010 Wang ................. F28D 15/0233
165/104.26

* cited by examiner

CONFORMABLE HEAT SPREADER

BACKGROUND

Electronic devices (e.g., transistors or semiconductors) generate heat when operating. As electronic devices are optimized and performance increases, the electronic devices generate more heat per unit area (e.g., watts per square millimeter). As the amount of heat per unit area increases, traditional heat dissipation techniques may not be adequate to regulate the temperature of the electronic devices.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, that embodiments herein may dissipate large amounts of heat generated in a small area. The present inventors have recognized, among other things, that embodiments herein may reduce the amount of thermal resistance at the interface between an electronic device and a heat spreader. The present subject matter may include the use of a heat spreader. The heat spreader may include a working fluid. The heat spreader may include a hollow housing. The hollow housing may define an interior chamber. The hollow housing may include a contact surface. The hollow housing may be configured to be physically compliant. The hollow housing may be physically compliant such that the housing conforms to the shape of a testing surface in response to an applied pressure. The testing surface may be a top surface of a semiconductor. The surface may be curved or non-uniform. The hollow housing may conform to the curvature or lack of uniformity of the testing surface such that minimal gaps exist between the hollow housing and the testing surface.

Decreasing the thermal resistance at the interface (e.g., between the contact surface and the testing surface) may improve heat transfer from the electronic device to the heat spreader. The thermal resistance at the interface may be decreased by increasing the intimacy (e.g., the amount of contact) between the electronic device and the heat spreader. The thermal resistance may be decreased by allowing the shape of the contact surface to conform (e.g., mimic, match, flex, yield, or comply) to the shape of the electronic device. In an example, a semiconductor may include a top surface. The top surface may be convex (e.g., dome-shaped). Additionally, the top surface may be non-uniform (e.g., rough or undulating). The curvature (or lack of uniformity) of the top surface may prevent the entire contact surface of the heat spreader from being in communication with the top surface. Configuring the contact surface to be physically compliant may allow for the heat spreader to conform to the shape (e.g., curvature) of the top surface, thereby allowing for more surface area of the contact surface to be in communication with the top surface. Configuring the contact surface to be physically compliant may allow for an increase in thermal conductivity (e.g., a decrease in thermal resistance) compared to solely using a thermal interface material between a non-physically compliant heat spreader and the top surface.

Aspect 1 may include or use subject matter (such as an apparatus, a system, a device, a method, a means for performing acts, or a device readable medium including instructions that, when performed by the device, may cause the device to perform acts), such as may include or use a heat spreader. The heat spreader may include a hollow housing. The hollow housing may define an interior chamber. The hollow housing may include a contact surface. The heat spreader may include a working fluid. The hollow housing may be configured to be physically compliant. The hollow housing may be configured to be physically compliant such that the hollow housing conforms to the shape of an interface surface (e.g., testing surface) in response to an applied pressure.

Aspect 2 may include or use, or may optionally be combined with the subject matter of Aspect 1, to optionally include or use that the applied pressure may be between 20 pounds-per-square-inch and 90 pounds-per-square-inch.

Aspect 3 may include or use, or may optionally be combined with the subject matter of one or any combination of Aspects 1 or 2 to optionally include or use a fluid transport material. The fluid transport material may be positioned in the interior chamber.

Aspect 4 may include or use, or may optionally be combined with the subject matter of Aspect 3 to optionally include or use that the fluid transport material may include a textured surface within the interior chamber.

Aspect 5 may include or use, or may optionally be combined with the subject matter of one or any combination of Aspects 3 or 4 to optionally include or use that the fluid transport material may be positioned at the periphery of the interior chamber.

Aspect 6 may include or use, or may optionally be combined with the subject matter of one or any combination of Aspects 3 through 5 to optionally include or use that the fluid transport material may include a wick material.

Aspect 7 may include or use, or may optionally be combined with the subject matter of Aspect 6 to optionally include or use that the wick material may include sintered metal.

Aspect 8 may include or use, or may optionally be combined with the subject matter of one or any combination of Aspects 3 through 7 to optionally include or use at least one protrusion extending from a top surface of the interior chamber. A gap may exist between the at least one protrusion and a portion of the fluid transport material.

Aspect 9 may include or use, or may optionally be combined with the subject matter of one or any combination of Aspects 3 through 8 to optionally include or use that the fluid transport material may define a void in the interior chamber.

Aspect 10 may include or use, or may optionally be combined with the subject matter of one or any combination of Aspects 1 through 9 to optionally include or use one or more protrusions extending from a top surface of the interior chamber. The one or more protrusions may extend toward a lower surface of the interior chamber. The one or more protrusions may extend from the lower surface of the interior chamber. The one or more protrusions may extend toward the upper surface of the interior chamber.

Aspect 11 may include or use, or may optionally be combined with the subject matter of one or any combination of Aspect 10 to optionally include or use that the protrusions may be linear.

Aspect 12 may include or use, or may optionally be combined with the subject matter of one or any combination of Aspects 10 or 11 to optionally include or use that the protrusions may be configured to deflect in response to an applied force.

Aspect 13 may include or use, or may optionally be combined with the subject matter of one or any combination of Aspects 1 through 12 to optionally include or use that the hollow housing may include a pedestal. The pedestal may extend outwardly from the interior chamber. The pedestal may include the contact surface.

Aspect 14 may include or use, or may optionally be combined with the subject matter of one or any combination of Aspects 1 through 13 to optionally include or use one or more through-holes. The one or more through-holes may extend from a top surface of the heat spreader to a bottom surface of the heat spreader. The one or more through-holes may extend into through the contact surface.

Aspect 15 may include or use subject matter (such as an apparatus, a system, a device, a method, a means for performing acts, or a device readable medium including instructions that, when performed by the device, may cause the device to perform acts), such as may include or use a heat spreading system. The heat spreading system may include a heat spreader. The heat spreader may include a hollow housing. The hollow housing may define an interior chamber. The hollow housing may include a contact surface. The heat spreader may include a working fluid. The hollow housing may be configured to mate with an electronic device. The hollow housing may be configured to be physically compliant. The hollow housing may be configured to be physically compliant such that the hollow housing conforms to a shape of the electronic device in response to an applied pressure. The heat spreading system may include a heat sink in communication with the heat spreader.

Aspect 16 may include or use, or may optionally be combined with the subject matter of Aspect 15, to optionally include or use that the applied pressure may be between 20 pounds-per-square-inch (PSI) and 90 PSI.

Aspect 17 may include or use, or may optionally be combined with the subject matter of one or any combination of Aspects 15 or 16 to optionally include or use a controller. The controller may be configured to actuate a cooling unit. Actuation of the cooling unit may regulate a temperature of the electronic device.

Aspect 18 may include or use, or may optionally be combined with the subject matter of one or any combination of Aspects 15 through 17 to optionally include or use a manifold. The manifold may be positioned in the interior chamber.

Aspect 19 may include or use, or may optionally be combined with the subject matter of one or any combination of Aspects 15 through 18 to optionally include or use a pump. The pump may be configured to transport the working fluid. The pump may be in communication with the fluid transport feature or the manifold.

Aspect 20 may include or use, or may optionally be combined with the subject matter of one or any combination of Aspects 15 through 19 to optionally include or use a digital pattern generator. The digital pattern generator may be configured to transmit a signal to the electronic device.

Aspect 21 may include or use, or may optionally be combined with the subject matter of one or any combination of Aspects 15 through 20 to optionally include or use that the electronic device may be a first electronic device. The heat spreading system may include a robotic arm. The robotic arm may be configured to position the heat spreader proximate the first electronic device or a second electronic device.

Aspect 22 may include or use subject matter (such as an apparatus, a system, a device, a method, a means for performing acts, or a device readable medium including instructions that, when performed by the device, may cause the device to perform acts), such as may include or use a method for dissipating heat in electronic devices. The method may include positioning a heat spreader proximate a first electronic device. The method may include mating a contact surface of the heat spreader with the first electronic device. The method may include applying pressure to the heat spreader such that the contact surface conforms to a shape of the first electronic device. The method may include maintaining the pressure for a first time interval.

Aspect 23 may include or use, or may optionally be combined with the subject matter of Aspect 22, to optionally include or use that the method may include separating the contact surface from the first electronic device. The method may include positioning the heat spreader proximate a second electronic device. The method may include mating the contact surface with the second electronic device. The method may include applying pressure to the heat spreader such that the contact surface conforms to a shape of the second electronic device. The method may include maintaining the pressure for a second time interval.

Aspect 24 may include or use, or may optionally be combined with the subject matter of one or any combination of Aspects 22 or 23 to optionally include or use that applying pressure to the heat spreader may include applying a pressure between 20 pounds-per-square-inch and 90 pounds-per-square-inch.

Aspect 25 may include or use, or may optionally be combined with the subject matter of one or any combination of Aspects 22 through 24 to optionally include or use that the method may include transmitting a signal through the electronic device.

Each of these non-limiting examples may stand on its own, or may be combined in various permutations or combinations with one or more of the other examples.

This overview is intended to provide an overview of subject matter of the present patent application. It is not intended to provide an exclusive or exhaustive explanation of the invention.

Figure 1:
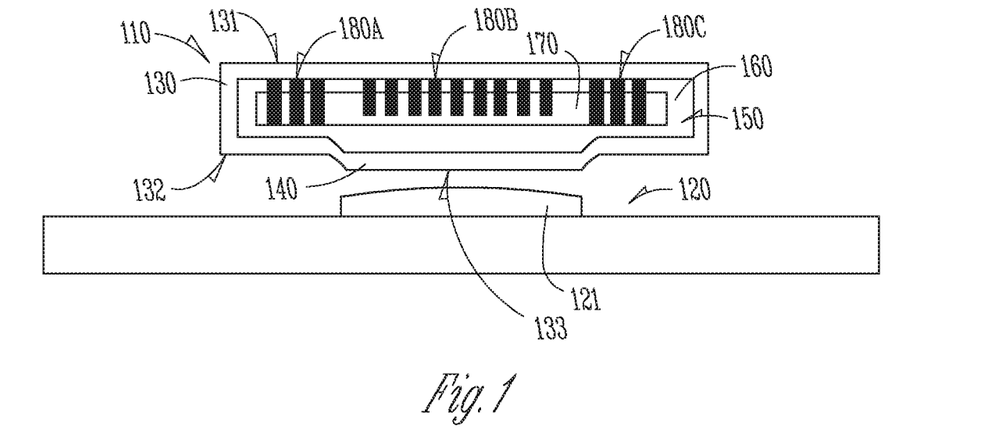
FIG. 1 illustrates a portion of a first testing system, including a first heat spreader and a device under testing, according to an example of the present subject matter.

FIG. 1 illustrates a portion of a first testing system 100, including a first heat spreader 110 and a device under testing 120, according to an example of the present subject matter. The first heat spreader 110 may include a hollow housing 130, a pedestal 140, an interior chamber 150, a fluid transport material 160, a void 170, a first set of protrusions 180A, a second set of protrusions 180B, and a third set of protrusions 180C. The device under testing may include an electronic device 121. The electronic device 121 may include a semiconductor. The electronic device 121 may have a top surface. The top surface may be uniform. The top surface may be non-uniform. The top surface of the electronic device 121 may be domed, rounded, non-uniform, or otherwise configured, such that the top surface is not a planar surface.

The hollow housing 130 may include an upper surface 131, a lower surface 132, and a contact surface 133. The contact surface 133 may be configured to mate with an interface surface (e.g., a testing surface). The interface surface may be the top surface of the electronic device 121. The hollow housing may include the pedestal 140. The pedestal 140 may extend outwardly (e.g., protrude from) the interior chamber 150. The pedestal 140 may include the contact surface 133.

The hollow housing 130 may define the interior chamber 150. The interior chamber 150 may include the fluid transport material 160. The fluid transport material 160 may be configured to allow for, or assist in, the flow of the working fluid throughout the interior chamber 150. The fluid transport material 160 may include a textured surface within the interior chamber 150. Stated another way, the walls of the interior chamber 150 (e.g., the inner walls of the hollow housing 130) may be textured and provide the fluid transport material 160. The fluid transport material 160 may include a wick material. The fluid transport material 160 may include sintered metal. The wick material may include the sintered metal. The fluid transport material 160 may be positioned at the periphery (e.g., along the walls) of the interior chamber 150. The void 170 may be included in the interior chamber 150. The fluid transport material 160 may define the void 170.

The first heat spreader 110 may optionally include at least one of the first set of protrusions 180A, the second set of protrusions 180B, and the third set of protrusions 180C, but the present subject matter is not so limited. The first set of protrusions 180A, the second set of protrusions 180B, and the third set of protrusions 180C may extend from a top surface of the interior chamber 150 toward a bottom surface of the interior chamber 150. The first set of protrusions 180A, the second set of protrusions 180B, and the third set of protrusions 180C may extend from the bottom surface of the interior chamber 150 toward the top surface of the interior chamber. As discussed herein, the first set of protrusions 180A, the second set of protrusions 180B, and the third set of protrusions 180C may provide tunable rigidity and conformity to the first heat spreader 110.

Figure 2:
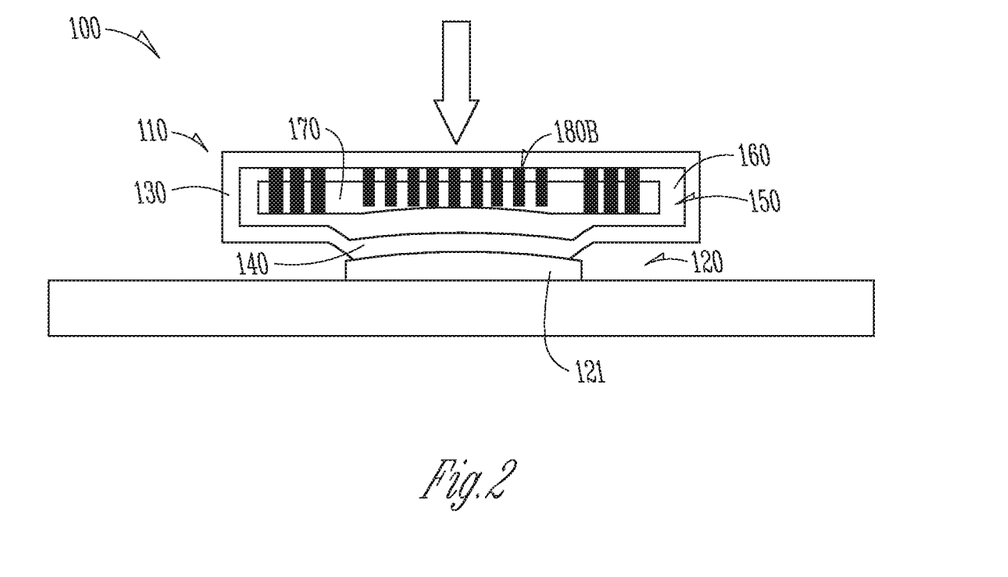
FIG. 2 illustrates a portion of the testing system, wherein the first heat spreader is in communication with the device under testing, according to an example of the present subject matter.

FIG. 2 illustrates a portion of the first testing system 100, wherein the first heat spreader 110 is in communication with the device under testing 120, according to an example of the present subject matter. The device under testing 120 may generate heat during operation. The heat generated by the device under testing 120 may be transferred into the first heat spreader 110 (e.g., through the contact surface 133 and/or the pedestal 140). The heat spreader 110 may allow for an increase in the amount of heat transfer from the device under testing 120 as compared to conventional techniques, such as a heat sink. The heat spreader 110 may provide a greater surface area to dissipate heat from the device under testing 120.

As heat is transferred into the first heat spreader 110, the working fluid that may be contained within interior chamber 150 may also be heated. The working fluid may include water, ammonia, methanol, ethanol, various chlorofluorocarbon-based refrigerants, or the like. However, other working fluids may be used as depending upon necessary properties (e.g., vapor pressure, boiling point, and material compatibility). The working fluid may be in a liquid state before being heated. As the working fluid is heated, the working fluid may change physical states (e.g., boil, or turn into a gaseous state). The working fluid may then flow from the fluid transport material 160 into the void 170. In an example the top surface of the interior chamber 150 may be cooler than the bottom surface of the interior chamber. As the gaseous working fluid flows within the void, the working fluid may communicate with the fluid transport material 160 positioned on the top surface of the interior chamber 160.

The communication of the working fluid with the top surface (or other surfaces, such as the sidewalls) of the interior chamber 150 may allow for the transfer of heat to the top surface (or other surfaces) of the interior chamber 150. The communication of the working fluid with the top surface of the interior chamber 150 may cause the working fluid to condense, and return to a liquid state. The working fluid may condense within the fluid transport material 160. The fluid transport material 160 may be configured to allow for the condensed working fluid to flow within the fluid transport material 160. The fluid transport material 160 may be configured to allow for the condensed working fluid to flow back toward the lower surface of the interior chamber 150. The fluid transport material 160 may be configured to allow for the condensed working fluid to flow back toward the heat source (e.g., the device under testing 120). The working fluid may flow through the fluid transport material 160 as a result of capillary action.

The hollow housing 130 may be configured to be physically compliant such that the hollow housing 130 conforms to the shape of a testing surface (e.g., the top surface of the electronic device 121) in response to an applied pressure (e.g., as denoted by the arrow in FIG. 2). The hollow housing 130 may be physically compliant such as by mimicking, matching, flexing, or yielding to the shape of the surface and thereby allowing the shape of the contact surface 133 to conform to the shape of the electronic device 121. In an example, the contact surface 133 may conform to (e.g., match the shape of) the rounded top surface of the electronic device 121. In an example, the pedestal 140 may contribute to the physical compliance of the heat spreader 110. In an example, the hollow housing 130 may contribute to the physical compliance of the heat spreader 110.

In an example, the heat spreader 110 may be brought into proximity of the device under testing 120 (e.g., in the position shown in FIG. 1). The heat spreader 110 may be placed into communication with the device under testing 120, such as the top surface of the electronic device 121. A pressure may be applied to the heat spreader 110 (e.g., normal to the top surface of the heat spreader 110). The pressure may be applied by a robotic arm or a testing apparatus. The applied pressure may be between 20 pounds-per-square-inch and 90 pounds-per-square-inch. The applied pressure may be sufficient to cause the elastic deformation of the contact surface 133. The applied pressure may cause the hollow housing 150 to conform to the shape of the testing surface (e.g., the top surface of the electronic device 121).

Conformance of the hollow housing 150 to the testing surface may improve heat transfer from the electronic device 121 to the heat spreader 110. Heat transfer from the electronic device 121 to the heat spreader 110 may be improved by decreasing the amount of thermal resistance (or conversely increasing the amount of thermal conductivity) between the electronic device 121 and the heat spreader 110. In an example wherein the heat spreader 110 is unable to conform to the shape of the electronic device 121, gaps may exist between the electronic device 121 and the heat spreader 110. The curvature of the top surface of the electronic device 121 may prevent the entire contact surface 133 of the heat spreader 110 from being in communication with the top surface.

Gaps may impede heat transfer and negatively affect temperature regulation of the electronic device 121. In an example, air may fill the gaps and provide a low rate of heat transfer between the electronic device 121 and the heat spreader 110. A thermal interface material may be used to fill in the gaps and decrease thermal resistance, as compared to air. The thermal interface material may have a higher thermal conductivity than air, and improve heat transfer between the electronic device 121 and the heat spreader 110. Gaps may be more likely to occur during manufacturing electrical tests of the electronic device 121 because thermal interface materials may not be used during those tests. Thermal interface material may not be used during testing because the thermal interface material may affect other manufacturing operations.

However, by configuring the first heat spreader 110 to conform to the shape of the electronic device 121, and either partially or entirely eliminating the gaps between the electronic device 121 and the first heat spreader 110, the amount of heat transfer may be improved in comparison to having thermal interface material or air filled gaps. Conformance of the first heat spreader 110 to the shape of the electronic device 121 may improve heat transfer because the thermal conductivity of air is less than the thermal conductivity of the heat spreader 110. In an example, the thermal conductivity of air is less than 0.05 Watts per meter Kelvin. The hollow housing 130 may include copper. The thermal conductivity of copper may be 401 Watts per meter Kelvin. Conformance of the heat spreader 110 to the shape of the electronic device 121 may improve heat transfer because the thermal conductivity of the first heat spreader 110 may be greater than the thermal conductivity of the thermal interface material. In an example, the thermal interface material may have a thermal conductivity of 2.9 Watts per meter Kelvin. As discussed herein, the hollow housing 130 may include copper. Copper may have a thermal conductivity of 401 Watts per meter Kelvin.

In an example, the top surface of the electronic device 121 may not be perfectly smooth. The top surface of the electronic device 121 may have microscopic surface roughness or imperfections. The contact surface 133 of the first heat spreader 110 may also have a microscopic surface roughness or imperfections. The thermal interface material, in conjunction with the physically compliant first heat spreader 110, may be used to further improve heat transfer between the electronic device 121 and the first heat spreader 110.

Figure 3:
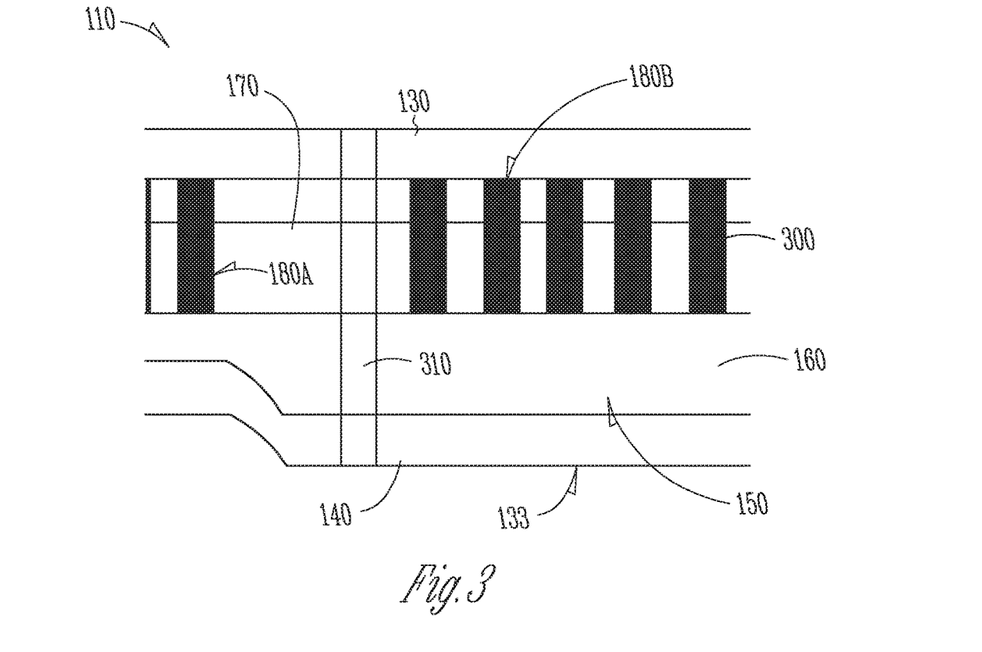
FIG. 3 illustrates an example of one or more first protrusions of the first heat spreader of FIGS. 1-2, according to an example of the present subject matter.

FIG. 3 illustrates an example of one or more first protrusions 300 of the first heat spreader 110 of FIGS. 1-2, according to an example of the present subject matter. The first heat spreader 110 may include the first set of protrusions 180A. The first heat spreader 110 may include the second set of protrusions 180B. The first set of protrusions 180A and/or the second set of protrusions 180B may each include one or more first protrusions 300. The one or more first protrusions 300 may be linear. The one or more first protrusions 300 may have a circular, square, rectangular, polygonal, or irregularly shaped cross section. The first set of protrusions 180A may extend from the top surface of the interior chamber 150, toward the bottom surface of the interior chamber 150. The first set of protrusions 180A may be in communication with the fluid transport material 160. The first set of protrusions 180A may extend through the fluid transport material 160. The third set of protrusions 180C (shown in FIG. 1) may be configured similarly to the first set of protrusions 180A.

The second set of protrusions 180B may extend from the top surface of the interior chamber 150, toward the bottom surface of the interior chamber 150. The second set of protrusions 180B may be in communication with the fluid transport material 160. The second set of protrusions 180B may extend through the fluid transport material 160. The second set of protrusions 180B may be in communication with the pedestal 140 (e.g., the portion of the interior chamber 150 that corresponds with the pedestal 140). The position, orientation, and dimensions of the first set of protrusions 180A, the second set of protrusions 180B, and the third set of protrusions 180C may be altered, fine-tuned, or otherwise engineered to meet the specific needs (e.g., the applied pressure necessary to cause conformance of the first heat spreader 110) required for the testing of the device under testing 120 (shown in FIGS. 1-2).

The heat spreader 110 may include one or more through-holes 310. The one or more through-holes 310 may extend from the top surface of the heat spreader 110 to the bottom surface of the heat spreader 110. The one or more through-holes 310 may be configured to provide thermal interface material (e.g., to the contact surface 133). The one or more through-holes 310 may extend through the contact surface 133 and/or the pedestal 140. The one or more through-holes 310 may be configured as a vacuum line. Configuring the through-holes 310 as a vacuum line may allow the device under testing 120 to be transported from a first position to a second position. Configuring the through-holes 310 as a vacuum line may assist the conformance of the heat spreader 110 to the device under testing 120. The vacuum line may assist in conformance by generating a force that contributes to the deflection of the contact surface 133. The one or more through-holes 310 may be positioned adjacent the first set of protrusions 180A, the second set of protrusions 180B, and the third set of protrusions 180C.

Figure 4:
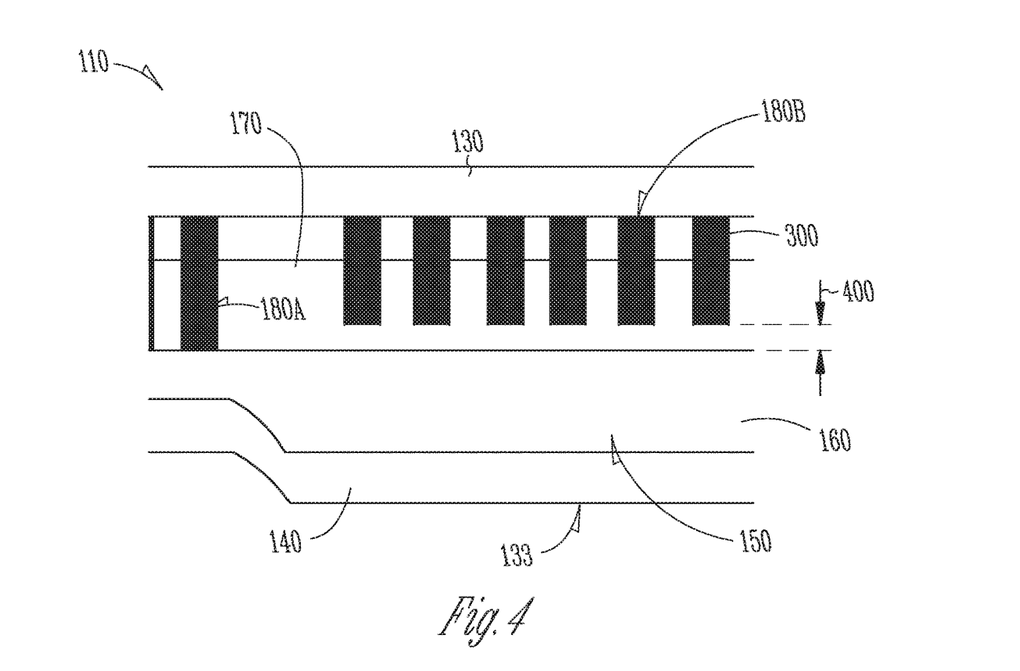
FIG. 4 illustrates another example of one or more first protrusions of the first heat spreader of FIGS. 1-2, according to an example of the present subject matter.

FIG. 4 illustrates another example of one or more first protrusions 300 of the first heat spreader 110 of FIGS. 1-2, according to an example of the present subject matter. The second set of protrusions 180B may extend from the top surface of the interior chamber 150. A gap 400 may exist between an end of the first set of protrusions 180B and the fluid transport material. The gap 400 may be between the first set of protrusions 180B and the pedestal 140. The dimension of the gap 400 may vary for each of the first protrusions 300 of the second set of protrusions 180B. Stated another way, the distance that each of the first protrusions 300 of the second set of protrusions 180B may protrude different distances from the top surface of the interior chamber 150. The first set of protrusions 180A and the third set of protrusions 180C (shown in FIG. 1) may be configured similarly to the second set of protrusions 180B.

Figure 5:
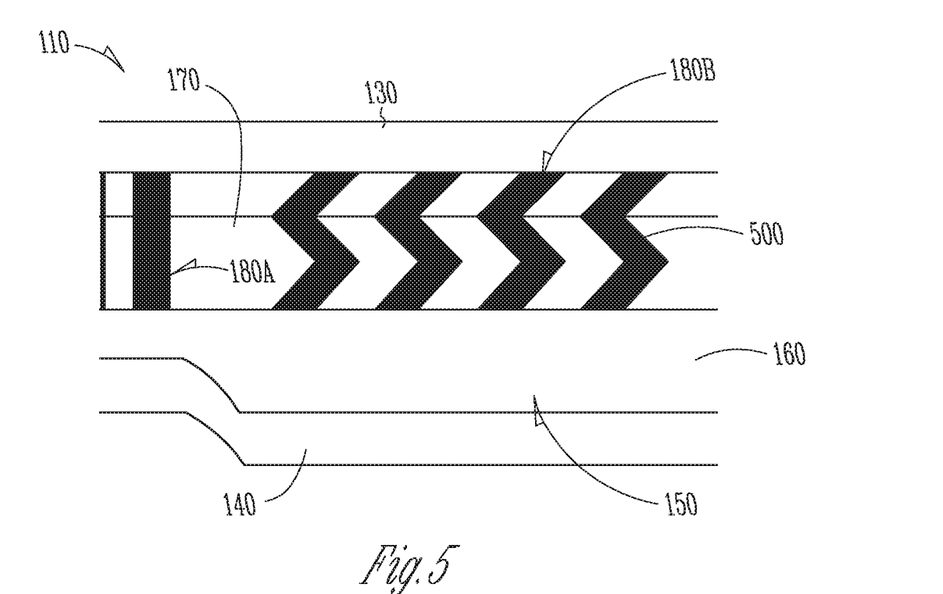
FIG. 5 illustrates an example of one or more second protrusions, according to an example of the present subject matter.

FIG. 5 illustrates an example of one or more second protrusions 500, according to an example of the present subject matter. The one or more second protrusions 500 may be included in the first set of protrusions 180A, the second set of protrusions 180B, or the third set of protrusions 180C (shown in FIG. 1). The one or more second protrusions 500 may be configured to deflect in response to the applied force. The one or more second protrusions 500 may be configured as springs, wherein the second protrusions 500 are displaced in response to the applied force. The stiffness of the second protrusions 500 may be altered, fine-tuned, or otherwise engineered to meet the specific needs required for the testing of the device under testing 120.

Additionally, combinations of the configurations of the first protrusions 300 and/or the second protrusions 500 may be used within the same sets of protrusions (e.g., the second set of protrusions 180B) to meet the specific needs for the testing of the device under testing 120. In an example, the second set of protrusion may include both the second protrusions 500 and the first protrusions 300 arranged such that the second protrusions 500 deflect in response to the applied force, and the first protrusions 300 limit the range of travel of the heat spreader 110 (e.g., limit the conformance of the pedestal 140). Further, the first set of protrusions 180A and the third set of protrusions 180C (shown in FIG. 1) may be configured to prevent the deflection of the hollow housing 130 in certain areas (e.g., in the areas outside of the contact surface 133 or the pedestal 140). Preventing the deflection of the hollow housing 130 in certain areas may allow for the hollow housing 130 to only bend in the certain regions, such as the pedestal 140.

Figure 6:
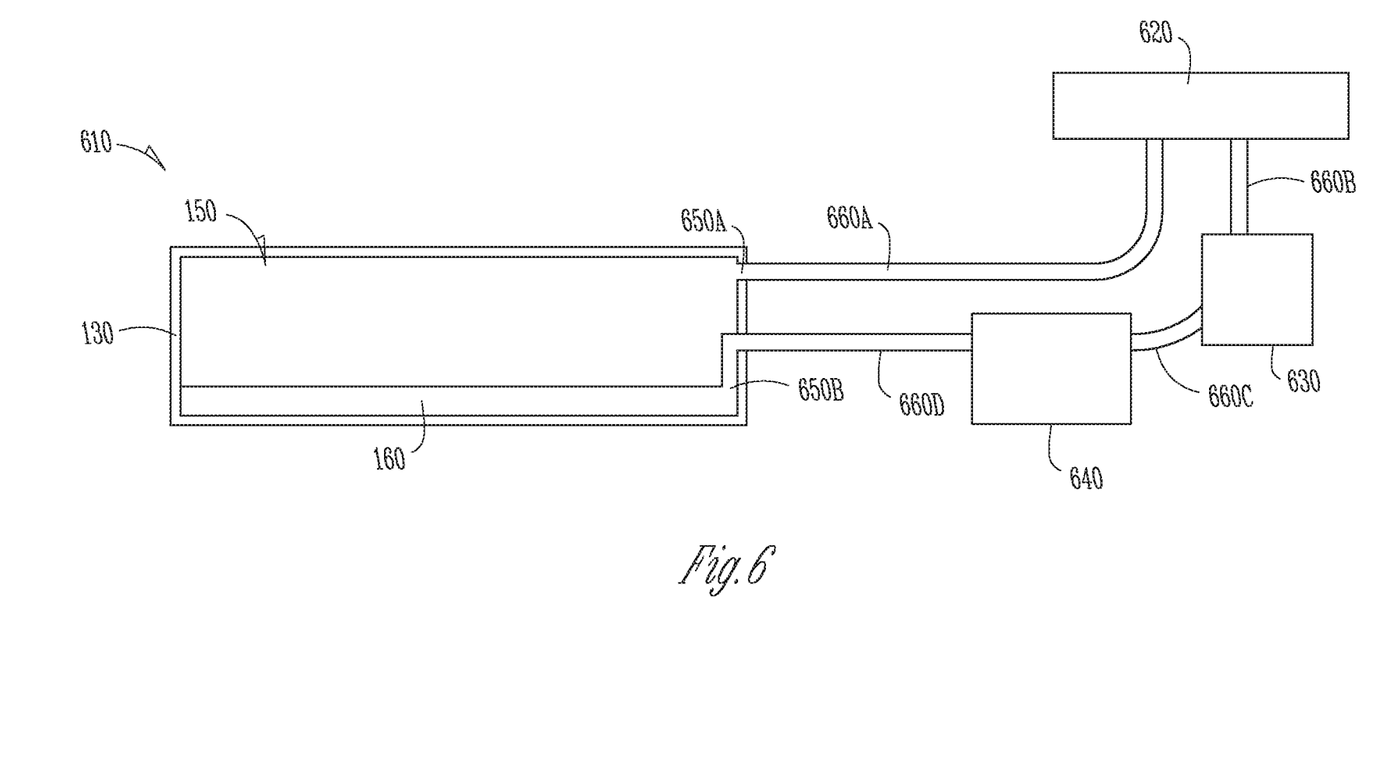
FIG. 6 illustrates a second heat spreader, according to an example of the present subject matter.

FIG. 6 illustrates a second heat spreader 610, according to an example of the present subject matter. The second heat spreader 610 may be included in the first testing system 100. The second heat spreader 610 may include the hollow housing 130, the interior chamber 150, a first pump 620, a condenser 630, an expansion valve 640, a first manifold 650A, a second manifold 650B, a first fluid line 660A, a second fluid line 660B, a third fluid line 660C, and a fourth fluid line 660D. The heat spreader 610 may include the fluid transport feature 160. The heat spreader 610 may include the working fluid. The fluid transport feature 160 may be in communication with, or included in, the second manifold 630B. The second heat spreader 610 may include a pedestal (e.g., the pedestal 140 of FIGS. 1-5).

The second heat spreader 610 may operate similar to the first heat spreader 110. In an example, the second heat spreader may be configured to transfer heat from a device under testing (e.g., the device under testing 120 of FIGS. 1 and 2). The heat generated by the device under testing may cause the working fluid to change states (e.g., boil).

The second heat spreader 610 may utilize a refrigeration cycle. The working fluid may be a refrigerant. In an example, the heat generated by the device under testing may cause the working fluid at the bottom of the interior chamber 150 (e.g., within the fluid transport feature 160 or the second manifold 660B to change from a liquid state (or a mixed liquid and gaseous state) to a gaseous state. The hollow housing 130 may be an evaporator. The gaseous working fluid may flow out of the fluid transport feature 160 or the second manifold 630B. The working fluid may enter the interior chamber 150. The flowing of the working fluid may transfer heat from a lower surface of the second heat spreader 610 to an upper surface of the second heat spreader 610.

The first pump 620 may cause (or assist) the working fluid to flow throughout the second heat spreader 610. The first pump 620 may be a compressor. The first pump 620 may cause the working fluid to flow from the interior chamber 150 into the first working fluid line 660A. The second heat spreader 610 may include a condenser 630. The first pump 620 may be in communication with the condenser 630 through a second fluid line 660B. The condenser 630 may cause the gaseous working fluid to change into a liquid state. The condenser 630 may be in communication with a heat sink (not shown). The flowing of the working fluid may transfer heat from a lower surface of the second heat spreader 610 to the condenser 630. The second heat spreader 610 may be in communication with an expansion valve 640 through a third working fluid line 660C. The expansion valve 640 may cause the liquid working fluid to change from a liquid state into a gaseous state, or a mix of a liquid and gaseous state. The expansion valve 640 may cause a decrease in temperature of the working fluid. The fourth working fluid line 640D may be used to transport the working fluid from the expansion valve 640 into the second manifold 650B.

Figure 7:
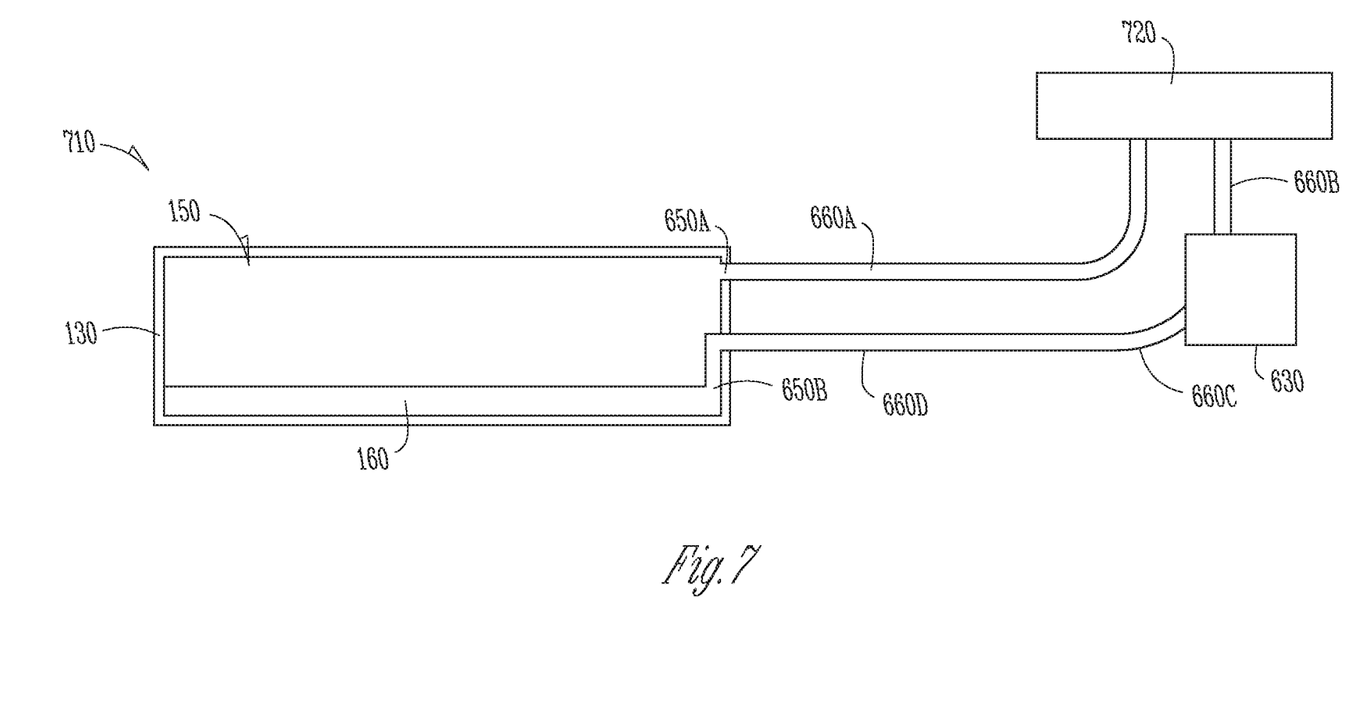
FIG. 7 illustrates a third heat spreader, according to an example of the present subject matter.

FIG. 7 illustrates a third heat spreader 710, according to an example of the present subject matter. The third heat spreader may be included in the first testing system 100. The third heat spreader 710 may operate similarly to the second heat spreader 610. The third heat spreader 710 may include the hollow housing 130, the interior chamber 150, a second pump 720, the condenser 630, the first manifold 650A, the second manifold 650B, the first fluid line 660A, the second fluid line 660B, and the third fluid line 660C. The heat spreader 710 may include the fluid transport feature 160. The third heat spreader 710 may include the working fluid. The fluid transport feature 160 may be in communication with, or included in, the second manifold 630B. The third heat spreader 710 may include a pedestal (e.g., the pedestal 140 of FIGS. 1-5).

The second pump 720 may include an accumulator. The accumulator may be configured to allow volume expansion of the working fluid due to boiling. The second pump 720 may be configured to transport the working fluid when the working fluid is in a mixed physical state (e.g., the working fluid simultaneously includes a gaseous and liquid state). The pump 720 may cause (or assist) the working fluid to flow within the third heat spreader 710. The condenser 630 may cause the gaseous working fluid to change into a liquid state. The condenser 630 may be in communication with a heat sink (not shown).

The third heat spreader 710 may operate similar to the first heat spreader 110 or the second heat spreader 610. In an example, the third heat spreader 710 may be configured to transfer heat from a device under testing (e.g., the device under testing 120 of FIGS. 1 and 2). The heat generated by the device under testing may cause the working fluid to change states (e.g., boil). The flowing of the working fluid may transfer heat from a lower surface of the third heat spreader 610 to the condenser 630. The third heat spreader 710 may be configured to allow the working fluid to flow through the third heat spreader 710 in a liquid, mixed, and/or gaseous state. The inclusion of the accumulator in the second pump 720 may allow for the working fluid to partially change states (e.g., be in a mixed physical state), and flow throughout the third heat spreader 710 without damaging the second pump 720

Figure 8:
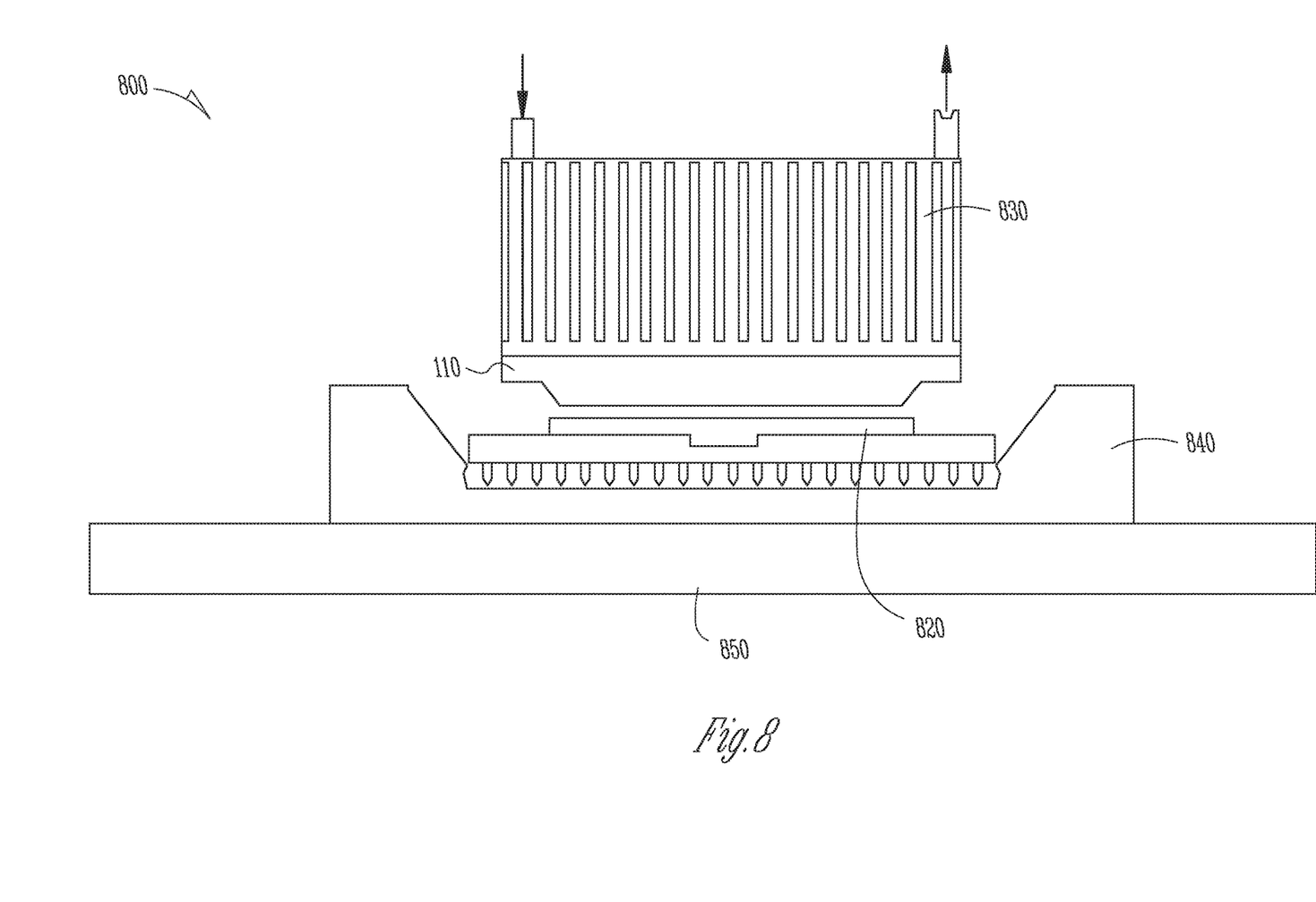
FIG. 8 illustrates a portion of a second testing system, including the first heat spreader and the device under testing, according to an example of the present subject matter.

FIG. 8 illustrates a portion of a second testing system 800, according to an example of the present subject matter. The second testing system 800 may include the first testing system 100. The second testing system 800 may include the first heat spreader 110 (shown in FIGS. 1-2). The second testing system 800 may include the second heat spreader 610 (shown in FIG. 6). The second testing system 800 may include the third heat spreader 710 (shown in FIG. 7). The second testing system 800 may include a plurality of heat spreaders (e.g., one or more of the first heat spreader 110, one or more of the second heat spreader 610, one or more of the third heat spreader 710, or a combination thereof). The second testing system 800 may include an electronic device 820. The second testing system 800 may include additional electronic devices. The second testing system 800 may be configured to test a plurality of electronic devices.

The second testing system 800 may include a heat sink 830. The heat sink 830 may be in communication with the heat spreader 110. The heat sink 830 may be configured to dissipate heat from the first heat spreader 810. The electronic device 820 may be mated to, and in electrical communication with, a socket 840. The socket 840 may be coupled to a substrate 850 (e.g., a printed circuit board). The socket 840 may be configured to route electrical signals from the electronic device 820 to the substrate 850.

Figure 9:
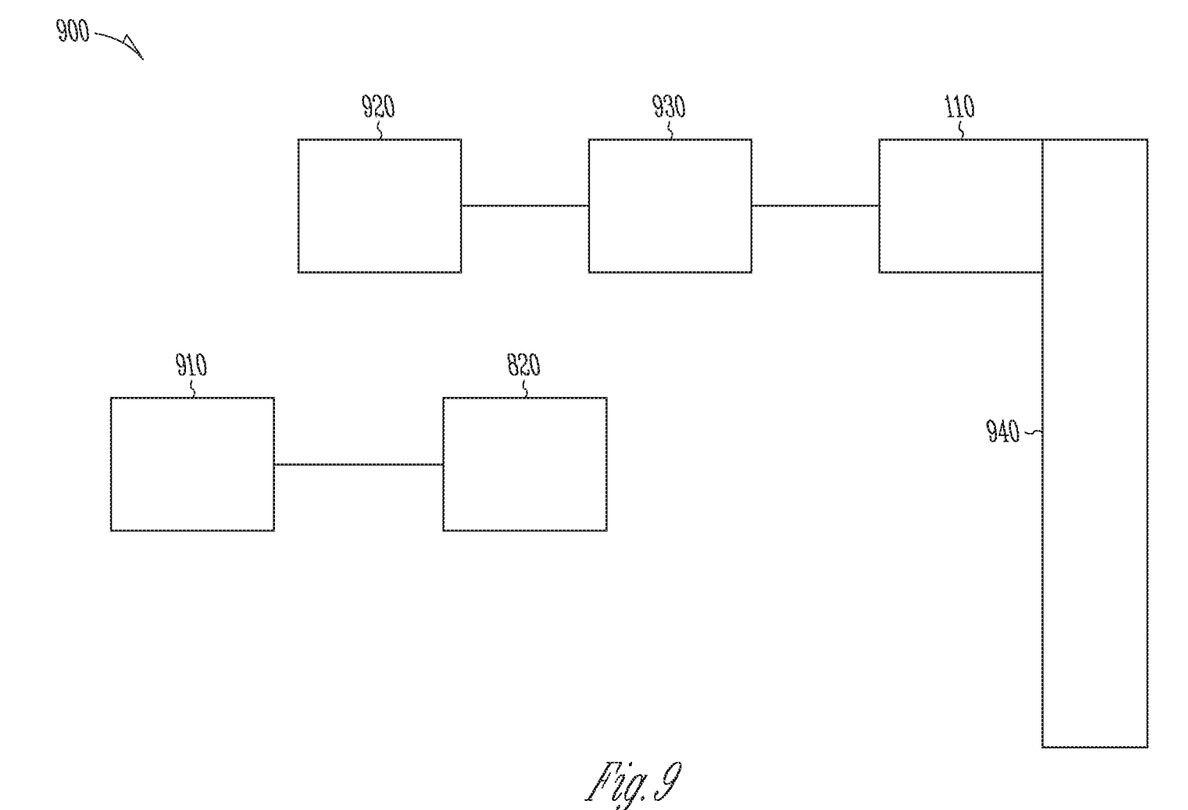
FIG. 9 illustrates a schematic representation of a third testing system 800, according to an example of the present subject matter.

FIG. 9 illustrates a schematic representation of a third testing system 900, according to an example of the present subject matter. The third testing system 900 may include the first testing system 100. The third testing system 800 may include the second testing system 800. In an example, the third testing system 900 includes the first heat spreader 110 (shown in FIGS. 1-5 and 8) and the electronic device 820 (shown in FIG. 8).

The third testing system 900 may include a digital pattern generator 910. The digital pattern generator 910 may be configured to transmit a signal to the electronic device 820. The signal transmitted to the electronic device 820 may be used to test the operational characteristics of the electronic device 820. Testing the operational characteristics of the electronic device 820 may ensure that the electronic device 820 is performing within design specifications. The signal transmitted to the electronic device 820 may cause the electronic device 820 to produce heat. The third testing system 900 may include a controller 920. The controller 920 may be configured to actuate a cooling unit 930. The cooling unit may be configured to dissipate heat, thereby regulating a temperature of the electronic device 820.

The third testing system 900 may include a robotic arm 940. The robotic arm 940 may be configured to position the first heat spreader 110 proximate the electronic device 820. The robotic arm 940 may be configured to position the first heat spreader 110 proximate additional electronic devices, such as the electronic device 121 (shown in FIGS. 1 and 2). The robotic arm 940 may be configured to transport the electronic device 820 from a first position to a second position. The controller 920 may be in communication with, and control or coordinate the operation of, the heat spreader 110, the electronic device 820, the pattern generator 910, the cooling unit 930, and/or the robotic arm 940.

Figure 10:
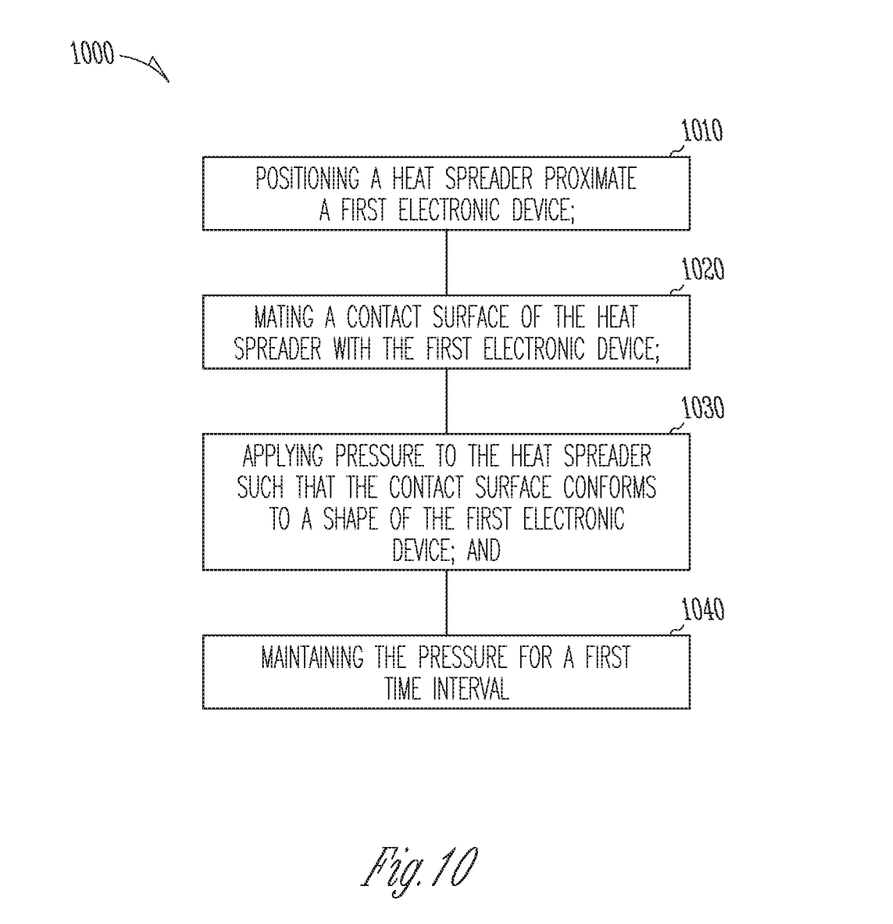
FIG. 10 illustrates a method for dissipating heat in electronic devices, according to an example of the present subject matter.

FIG. 10 illustrates a method 1000 for dissipating heat in electronic devices, according to an example of the present subject matter. The method 1000 may include at operation 1010 positioning a heat spreader proximate (e.g., the first heat spreader 110 of FIGS. 1-5 and 8-9 or the second heat spreader 610 of FIG. 6) a first electronic device (e.g., the electronic device 121 of FIGS. 1-2 or the electronic device 820 of FIG. 8). The method 1000 may include at operation 1020 mating a contact surface (e.g., the contact surface 133 of FIGS. 1-5) of the heat spreader with the first electronic device. The method 1000 may include at operation 1030 applying pressure to the heat spreader such that the contact surface conforms to a shape of the first electronic device. The method 1000 may include at operation 1040 maintaining the pressure for a first time interval. The method 1000 may include separating the contact surface from the first electronic device. The method 1000 may additionally include positioning the heat spreader proximate a second electronic device. The method 1000 may further include mating the contact surface with the second electronic device. The method 1000 may include applying pressure to the heat spreader such that the contact surface conforms to a shape of the second electronic device. The method 1000 may still yet further include maintaining the pressure for a second time interval. The method 1000 may include that applying pressure to the heat spreader includes applying a pressure between 20 pounds-per-square-inch and 90 pounds-per-square-inch. The method 1000 may include transmitting a signal through the electronic device.

Various Notes

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A heat spreader, comprising:
   a hollow housing defining an interior chamber and including a contact surface configured to mate with an interface surface;
   a working fluid located in the interior chamber;
   a first set of protrusions extending from a first surface of the interior chamber toward a second surface of the interior chamber; and
   wherein the hollow housing is configured to be physically compliant such that the hollow housing conforms to the shape of the interface surface in response to an applied pressure.

2. The heat spreader of claim 1, wherein the applied pressure is between 20 pounds-per-square-inch and 90 pounds-per-square-inch.

3. The heat spreader of claim 1, further comprising a fluid transport material positioned in the interior chamber.

4. The heat spreader of claim 3, wherein the fluid transport material includes a textured surface within the interior chamber.

5. The heat spreader of claim 3; wherein the fluid transport material is positioned at the periphery of the interior chamber.

6. The heat spreader of claim 3, wherein the fluid transport material includes a wick material.

7. The heat spreader of claim 6, wherein the wick material includes sintered metal.

8. The heat spreader of claim 3, further comprising at least one protrusion extending from a top surface of the interior chamber, and wherein a gap exists between the at least one protrusion and a portion of the fluid transport material.

9. The heat spreader of claim 3, wherein the fluid transport material defines a void in the interior chamber.

10. The heat spreader of claim 1, further comprising a second set of protrusions located between the first surface and the second surface.

11. The heat spreader of claim 10, wherein the second set of protrusions have a different dimension than the first set of protrusions.

12. The heat spreader of claim 1, wherein the protrusions are configured to deflect in response to an applied force.

13. The heat spreader of claim 1, wherein the hollow housing includes a pedestal, the pedestal extending outwardly from the interior chamber and including the contact surface.

14. The heat spreader of claim 1, further comprising one or more through-holes extending from a top surface of the heat spreader to a bottom surface of the heat spreader.

15. A heat spreading system, comprising:
   a heat spreader, including:
   a hollow housing defining an interior chamber and including a contact surface;
   a working fluid;
   a first set of protrusions extending from a first surface of the interior chamber toward a second surface of the interior chamber; and
   wherein the hollow housing is configured to mate with an electronic device, and wherein the hollow housing is configured to be physically compliant such that the hollow housing conforms to a shape of the electronic device in response to an applied pressure;
   a heat sink in communication with the heat spreader.

16. The system of claim 15, wherein the applied pressure is between 20 pounds-per-square-inch (PSI) and 90 PSI.

17. The system of claim 15, further comprising a controller configured to actuate a cooling unit, thereby regulating a temperature of the electronic device.

18. The system of claim 15, further comprising a manifold positioned in the interior chamber.

19. The system of claim 18, further comprising a pump configured to transport the working fluid, and wherein the pump is in communication with a fluid transport feature.

20. The system of claim 16, further comprising a digital pattern generator configured to transmit a signal to the electronic device.

21. The system of claim 16, wherein the electronic device is a first electronic device, and further comprising a robotic arm, wherein the robotic arm is configured to position the heat spreader proximate the first electronic device or a second electronic device.

22. A method for dissipating heat in electronic devices, comprising:
   positioning a heat spreader proximate a first electronic device;
   mating a contact surface of the heat spreader with the first electronic device;
   applying pressure to the heat spreader such that the contact surface conforms to a shape of the first electronic device; and
   wherein the heat spreader includes a first set of protrusions extending from a first surface of an interior chamber of the heat spreader toward a second surface of the interior chamber.

23. The method of claim 22, further comprising maintaining the pressure for a first time interval.

24. The method of claim 22, further comprising:
separating the contact surface from the first electronic device;
positioning the heat spreader proximate a second electronic device;
mating the contact surface with the second electronic device;
applying pressure to the heat spreader such that the contact surface conforms to a shape of the second electronic device; and
maintaining the pressure for a second time interval.

25. The method of claim 22, wherein applying pressure to the heat spreader includes applying a pressure between 20 pounds-per-square-inch and 90 pounds-per-square-inch.

* * * * *

UNITED STATES PATENT AND TRADEMARK OFFICE
CERTIFICATE OF CORRECTION

PATENT NO. : 10,566,263 B2
APPLICATION NO. : 15/718337
DATED : February 18, 2020
INVENTOR(S) : Walczyk et al.

Page 1 of 1

It is certified that error appears in the above-identified patent and that said Letters Patent is hereby corrected as shown below:

In the Claims

Column 13, Line 59, Claim 5, delete "claim 3;" and insert --claim 3,-- therefor

Signed and Sealed this
Thirtieth Day of November, 2021

Drew Hirshfeld
*Performing the Functions and Duties of the
Under Secretary of Commerce for Intellectual Property and
Director of the United States Patent and Trademark Office*